United States Patent
Kumei (10) Patent No.: US 8,654,802 B2
(45) Date of Patent: Feb. 18, 2014

(54) VERTICAL-CAVITY SURFACE-EMITTING LASER ARRAY, VERTICAL-CAVITY SURFACE-EMITTING LASER DEVICE, OPTICAL TRANSMISSION APPARATUS, AND INFORMATION PROCESSING APPARATUS

(75) Inventor: Masaya Kumei, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/368,011

(22) Filed: Feb. 7, 2012

(65) Prior Publication Data

US 2013/0022063 A1 Jan. 24, 2013

(30) Foreign Application Priority Data

Jul. 22, 2011 (JP) ................. 2011-160627

(51) Int. Cl.
*H01S 3/10* (2006.01)
*H01S 5/00* (2006.01)

(52) U.S. Cl.
USPC ............... 372/27; 372/50.12; 372/50.124

(58) Field of Classification Search
USPC ................. 372/50.124, 27, 50.12
See application file for complete search history.

(56) References Cited

U.S. PATENT DOCUMENTS

| | | | | |
|---|---|---|---|---|
| 5,283,447 A * | 2/1994 | Olbright et al. | ............... | 257/85 |
| 2001/0026567 A1 | 10/2001 | Kaneko et al. | | |
| 2011/0027925 A1 * | 2/2011 | Ikuta | ............... | 438/31 |
| 2011/0318020 A1 * | 12/2011 | Kondo et al. | ............... | 398/182 |

FOREIGN PATENT DOCUMENTS

| | | |
|---|---|---|
| JP | 2001-189525 A | 7/2001 |
| JP | 2003-145933 A | 5/2003 |
| JP | 2003-332685 A | 11/2003 |
| JP | 2011-3748 A | 1/2011 |

OTHER PUBLICATIONS

J. M. Ostermann, P. Devernardi, A. Kroner & R. Michalzik, Polarization-Controlled Surface Grating VCSELs Under Externally Induced Anisotropic Strain, Sep. 2007, IEEE Photonics Technology Letters, vol. 19, No. 17 pp. 1301-1303.*

K. Panajotov, B. Nagler, G. Verschaffelt, J. Albert, J. Danckaert, I. Veretennicoff, H. Thienpont., J. Yong & J. Rorison, In-plane Strain Modification of Polarization Behavior of Vertical-Cavity Surface-Emitting Lasers, 2001, SPIE vol. 4286 pp. 55-62.*

T. Mukaihara, F. Koyama & K. Iga, Feb. 1993, Engineering Polarization Control of GaAs/AlGaAS Surface-Emitting Lasers by Anisotropic Stress from Elliptical Etched Substrate Hole, IEEE Photonics Technology Letters, vol. 5, No. 2, pp. 133-135.*

* cited by examiner

*Primary Examiner* — Armando Rodriguez
(74) *Attorney, Agent, or Firm* — Sughrue Mion, PLLC (57) ABSTRACT

A vertical-cavity surface-emitting laser array includes a substrate having an element forming area, multiple columnar structures formed in the element forming area on the substrate, and at least one metal wire formed adjacent to the multiple columnar structures. Each columnar structure includes a lower semiconductor reflector of a first conductivity type, an upper semiconductor reflector of a second conductivity type, and an active region formed between the lower semiconductor reflector and the upper semiconductor reflector. The columnar structure emits light in a direction perpendicular to the substrate. The at least one metal wire has a distortion applying segment that extends in the same direction relative to the multiple columnar structures.

12 Claims, 8 Drawing Sheets

VERTICAL-CAVITY SURFACE-EMITTING LASER ARRAY, VERTICAL-CAVITY SURFACE-EMITTING LASER DEVICE, OPTICAL TRANSMISSION APPARATUS, AND INFORMATION PROCESSING APPARATUS

CROSS-REFERENCE TO RELATED APPLICATIONS

This application is based on and claims priority under 35 USC 119 from Japanese Patent Application No. 2011-160627 filed Jul. 22, 2011.

BACKGROUND (i) Technical Field

The present invention relates to vertical-cavity surface-emitting laser arrays, vertical-cavity surface-emitting laser devices, optical transmission apparatuses, and information processing apparatuses.

SUMMARY

According to an aspect of the invention, there is provided a vertical-cavity surface-emitting laser array including a substrate having an element forming area, multiple columnar structures formed in the element forming area on the substrate, and at least one metal wire formed adjacent to the multiple columnar structures. Each columnar structure includes a lower semiconductor reflector of a first conductivity type, an upper semiconductor reflector of a second conductivity type, and an active region formed between the lower semiconductor reflector and the upper semiconductor reflector. The columnar structure emits light in a direction perpendicular to the substrate. The at least one metal wire has a distortion applying segment that extends in the same direction relative to the multiple columnar structures.

BRIEF DESCRIPTION OF THE DRAWINGS

Exemplary embodiment(s) of the present invention will be described in detail based on the following figures, wherein.

DETAILED DESCRIPTION

Exemplary embodiments of the present invention will now be described with reference to the drawings. The following description relates to a vertical-cavity surface-emitting laser (VCSEL) of a selective oxidation type as an example, and the vertical-cavity surface-emitting laser will be referred to as "VCSEL" hereinafter. Furthermore, an array of multiple light-emitting elements arranged on a single substrate will be referred to as "VCSEL array" hereinafter. It should be noted that the scale in the drawings has been emphasized to provide an easier understanding of the exemplary embodiments of the present invention, but may be not the same as that of an actual device.

Exemplary Embodiments

Figure 1:
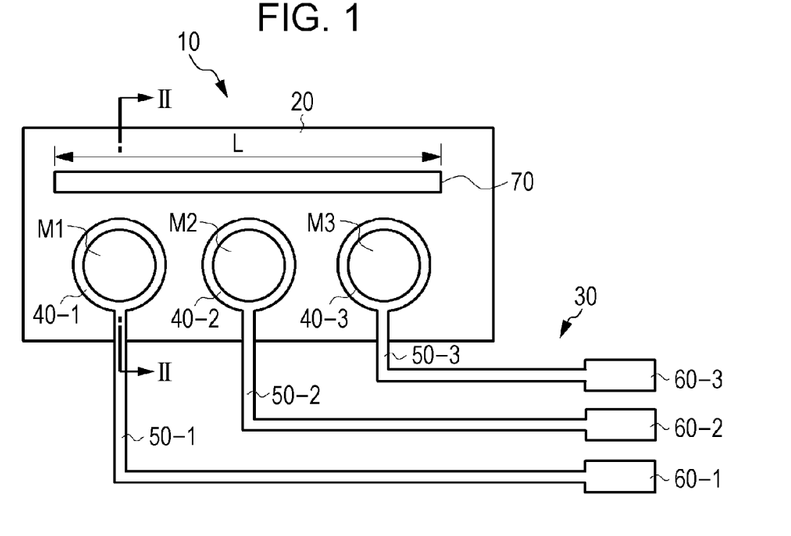
FIG. 1 is a schematic plan view of a vertical-cavity surface-emitting laser array according to a first exemplary embodiment of the present invention.

FIG. 1 is a schematic plan view of a VCSEL array according to a first exemplary embodiment of the present invention. A VCSEL array 10 according to the first exemplary embodiment is formed of an array of multiple light-emitting elements arranged on a single GaAs substrate. Ultimately, the substrate is cut into a rectangular chip. The VCSEL array 10 may include an element forming area 20 for forming the multiple light-emitting elements, and a wiring forming area 30 for forming electrode wires 50 and electrode pads 60 that are connected to the multiple light-emitting elements.

In the example shown in FIG. 1, the element forming area 20 is formed by etching semiconductor layers stacked on the substrate to a certain depth, and has a rectangular outline. Thus, the wiring forming area 30 is formed on the periphery of the element forming area 20 with a certain step interposed therebetween. The element forming area 20 has three mesas M1, M2, and M3 (collectively referred to as "mesas M") that serve as the light-emitting elements. The mesas M1, M2, and M3 each have a columnar structure that protrudes in the form of a cylinder from the base surface of the element forming area 20, and are linearly arranged. Although the mesas M are cylindrical, the mesas M may alternatively be elliptical, conical, or rectangular.

One mesa corresponds to one light-emitting element and includes a vertical cavity on the substrate. Laser light is emitted in a direction perpendicular to the substrate from the top of each mesa M. The laser light to be emitted may be in a fundamental transverse mode. Annular electrodes 40-1, 40-2, and 40-3 (collectively referred to as "annular electrodes 40") are formed on the top of the mesas M1, M2, and M3, respectively. The annular electrodes 40 are electrically connected to semiconductor layers at the p-side of the mesas M. The annular electrodes 40-1, 40-2, and 40-3 are respectively connected to electrode wires 50-1, 50-2, and 50-3 (collectively referred to as "electrode wires 50"). The electrode wires 50 extend to the wiring forming area 30 via the base surface and a side surface of the element forming area 20 so as to be connected to electrode pads or terminals 60-1, 60-2, and 60-3. The mesas M1, M2, and M3 are individually driven by selectively applying driving power to the electrode pads 60-1, 60-2, and 60-3.

The base surface of the element forming area 20 is provided with a metal wire 70 disposed adjacent to the mesas M. The metal wire 70 extends in the same direction relative to all of the mesas M1, M2, and M3. In other words, the metal wire 70 applies distortion to the mesas M1, M2, and M3. Therefore, the extending direction of the metal wire 70 relative to the mesa M1 is the same as the extending direction of the metal wire 70 relative to the mesa M2, and is also the same as the extending direction of the metal wire 70 relative to the mesa M3. In the case where the mesas M are linearly arranged, the metal wire 70 extends parallel to the linearly-arranged direction of the mesas M. As will be described later, the metal wire 70 applies distortion to active layers of the mesas M1, M2, and M3 so that the mesas M1, M2, and M3 receiving this distortion may emit laser light that is polarization-controlled in the same direction.

Figure 2:
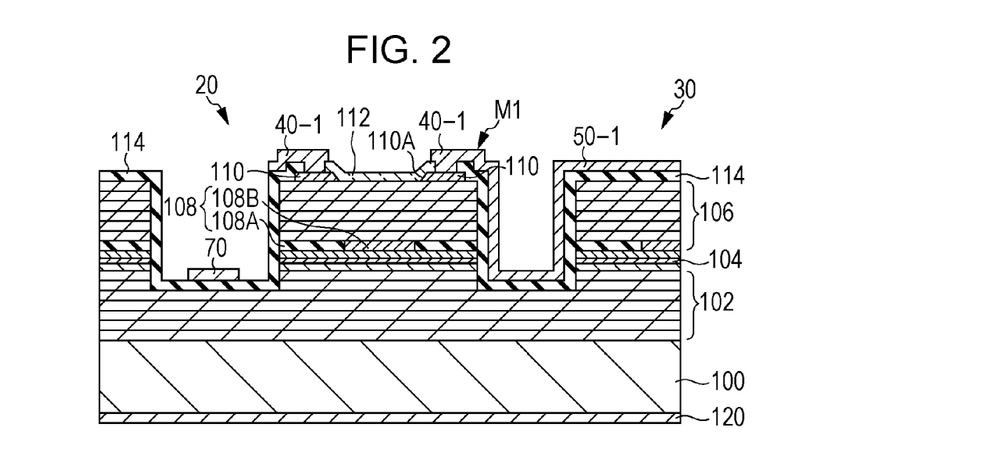
FIG. 2 is a cross-sectional view of the vertical-cavity surface-emitting laser array, taken along line II-II in FIG. 1.

FIG. 2 illustrates a typical configuration of the VCSEL. FIG. 2 is a cross-sectional view of the mesa M1, taken along line II-II in FIG. 1. As shown in FIG. 2, a VCSEL element of the mesa M1 has a multilayer structure that includes an n-type lower distributed Bragg reflector (DBR) 102 formed by alternately stacking AlGaAs layers having different Al compositions on an n-type GaAs substrate 100, an active region 104 formed on the lower DBR 102 and including a quantum well layer interposed between upper and lower spacer layers, and a p-type upper DBR 106 formed on the active region 104 by alternately stacking AlGaAs layers having different Al compositions. The n-type lower DBR 102 is, for example, a multilayer body having pairs of $Al_{0.9}Ga_{0.1}As$ layers and $Al_{0.3}Ga_{0.7}As$ layers. The thickness of each layer is $\lambda/4n_r$ ($\lambda$ being the oscillation wavelength and $n_r$ being the refractive index of a medium). The pairs are alternately stacked in 40 periods. A carrier concentration obtained after doping the lower DBR 102 with silicon, which is an n-type impurity, is, for example, $3 \times 10^{18}$ cm$^{-3}$. In the active region 104, the lower spacer layer is, for example, an undoped $Al_{0.6}Ga_{0.4}As$ layer, the quantum well active layer includes an undoped $Al_{0.11}Ga_{0.89}As$ quantum well layer and an undoped $Al_{0.3}Ga_{0.7}As$ barrier layer, and the upper spacer layer is an undoped $Al_{0.6}Ga_{0.4}As$ layer. The p-type upper DBR 106 is, for example, a multilayer body having pairs of $Al_{0.9}Ga_{0.1}As$ layers and $Al_{0.3}Ga_{0.7}As$ layers. The thickness of each layer is $\lambda/4n_r$. The pairs are alternately stacked in 24 periods. A carrier concentration obtained after doping the upper DBR 106 with carbon, which is a p-type impurity, is, for example, $3 \times 10^{18}$ cm$^{-3}$. An uppermost layer of the upper DBR 106 is a contact layer composed of p-type GaAs, and a lowermost layer or an intermediate layer of the upper DBR 106 is a current confinement layer 108 composed of p-type AlAs.

By etching the semiconductor layers from the upper DBR 106 to the lower DBR 102, the cylindrical mesas M are formed on the substrate 100. The etching of each mesa M may be performed until reaching a depth at which at least the side surface of the current confinement layer 108 is exposed. The current confinement layer 108 is exposed at the side surface of each mesa M and has an oxidized region 108A formed by selectively oxidizing the side surface and an electrically conductive region (oxidized aperture) 108B surrounded by the oxidized region 108A. In the oxidization process for the current confinement layer 108, the oxidization rate of the AlAs layer is higher than that of the AlGaAs layers, and the oxidization progresses at a substantially fixed rate from the side surface of the mesa M toward the inside thereof. Therefore, an inner surface of the electrically conductive region 108B that is parallel to a principal surface of the substrate 100 has a circular shape that corresponds to the outline of the mesa M, and the center of the circle is aligned with the axial center of the mesa M, that is, the optical axis. The diameter of the electrically conductive region 108B is set to 5 μm or smaller in a case where a fundamental transverse mode is to be obtained, for example, in a 780-nm waveband.

The uppermost layer or the top of the mesa M is provided with an annular p-side electrode 110 composed of metal. For example, the p-side electrode 110 is composed of metal, such as Au or Ti/Au layers, and is ohmic-connected to the contact layer of the upper DBR 106. A central area of the p-side electrode 110 is provided with a circular opening. The opening defines a light emission port 110A that emits light. The center of the light emission port 110A may be aligned with the optical axis of the mesa M, and the diameter of the light emission port 110A may be larger than the diameter of the electrically conductive region 108B. The light emission port 110A may be covered with a circular emission protection film 112 that is transparent relative to the oscillation wavelength. The undersurface of the substrate 100 is provided with an n-side electrode 120 that is shared by the mesas M1, M2, and M3.

An interlayer insulating film 114 is formed so as to cover the base, the side, and the top of the mesas M. At the top of each mesa M, a circular contact hole is formed in the interlayer insulating film 114. The annular electrodes 40 are connected to the p-side electrodes 110 via the contact holes. The annular electrodes 40 are connected to the electrode wires 50. The electrode wires 50 extend to the wiring forming area 30 through the side and the base of the mesas M via the interlayer insulating film 114. Furthermore, the metal wire 70 is formed at the base of the mesas M via the interlayer insulating film 114. The metal wire 70 is formed in a rectangular pattern that extends from the mesa M1 to the mesa M3.

Figure 3:
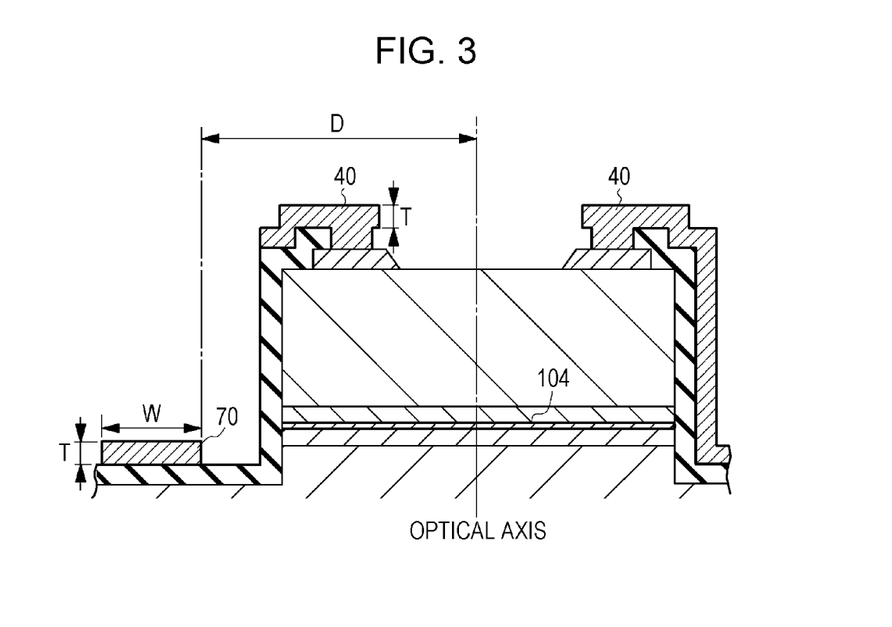
FIG. 3 is a diagram for explaining the relationship between a mesa and a metal wire that applies distortion thereto.

FIG. 3 is a diagram for explaining the details of the metal wire 70. As described above, the metal wire 70 extends in the same direction relative to all of the mesas M and applies distortion to the active regions 104 of the mesas M. Specifically, the metal wire 70 formed on the interlayer insulating film 114 has internal stress and utilizes this internal stress to apply anisotropic distortion or stress in a fixed direction to the active regions 104 in all of the mesas M. The metal wire 70 in this example is patterned so as to have a fixed width W, a fixed thickness T, and a fixed length L (see FIG. 1). The metal wire 70 is formed at a fixed distance D from the active regions 104. The distance D shown in FIG. 3 indicates a dimension from the optical axis of each mesa M to an edge of the metal wire 70. The W, T, L, and D values are appropriately selected so that the metal wire 70 may apply certain stress or distortion to the active regions 104. For example, the distance D is set to several micrometers.

For example, the metal wire 70 is formed using the same material as that used for the electrode wires 50 so that the metal wire 70 and the electrode wires 50 may be formed simultaneously in the same process. If the electrode wires 50 are formed using the same material as that used for the annular electrodes 40, the metal wire 70, the electrode wires 50, and the annular electrodes 40 may be formed simultaneously in the same process. For example, the metal wire 70 and the electrode wires 50 are composed of gold (Au). By performing an annealing process at 370° C. after patterning the gold, the metal wire 70 would have a tensile stress of about 200 MP.

The metal wire 70 and the electrode wires 50 may alternatively have a multilayer structure including a gold layer and a metal layer other than a gold layer. For example, the multilayer structure may include two metal layers of Au/Ti. The aforementioned metallic materials are merely examples. The metal wire 70 and the electrode wires 50 may be formed using any kind of a metallic material or materials having electrical conductivity and certain internal stress. Furthermore, although FIG. 2 shows an example of each mesa M in which the annular electrode 40 is connected to the p-side electrode 110, the annular electrode 40 may be directly ohmic-connected to the contact layer of the upper DBR 106 without the intervention of the p-side electrode 110.

Accordingly, the metal wire 70 functions as a wire that applies anisotropic distortion to all of the mesas M so that anisotropic distortion is generated in the active regions 104 of the mesas M, thereby stabilizing the polarization to a certain direction in all of the mesas M. Although the element forming area 20 and the wiring forming area 30 on the substrate 100 are separated from each other in the above example, the wiring forming area 30 is omittable where appropriate. In that case, the electrode wires 50 and the electrode pads 60 may be formed on the base surface of the element forming area 20 where the metal wire 70 is formed.

Figure 4:
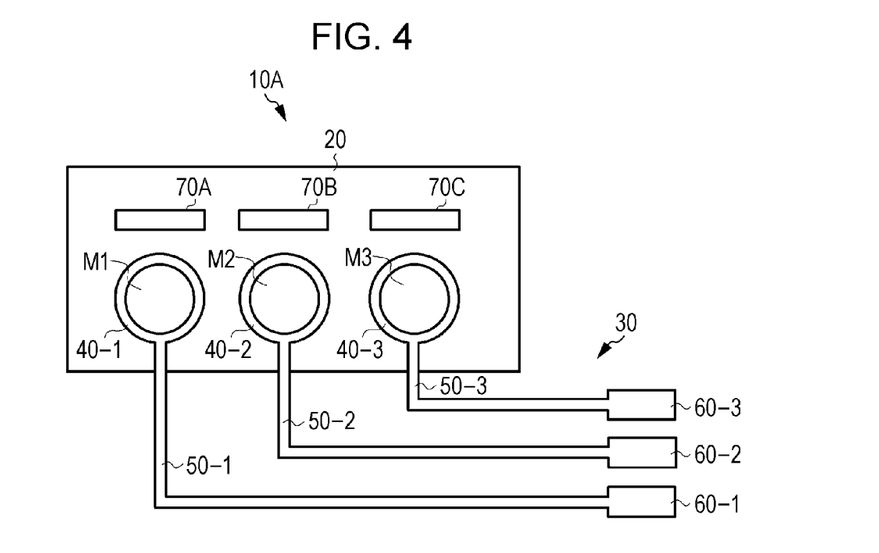
FIG. 4 is a plan view showing a modification of the vertical-cavity surface-emitting laser array according to the first exemplary embodiment.

FIG. 4 is a schematic plan view of a VCSEL array 10A according to a modification of the first exemplary embodiment. In contrast to the first exemplary embodiment described above in which a single continuous metal wire 70 is formed for the mesas M1, M2, and M3, this modification has discontinuous metal wires 70A, 70B, and 70C for the mesas M1, M2, and M3. The metal wires 70A, 70B, and 70C extend in the same direction relative to the respective mesas M1, M2, and M3 and have a sufficient distance D and length L for applying anisotropic distortion to the active regions of the mesas M.

Next, a second exemplary embodiment of the present invention will be described. Although the metal wire 70 for applying distortion is provided separately from the annular electrodes 40 of the mesas M in the first exemplary embodiment, metal wires for applying distortion in the second exemplary embodiment also function as the annular electrodes 40 of the mesas M. With the metal wires also functioning as annular electrodes, a space-saving configuration may be achieved, thereby allowing for a high-density VCSEL array.

Figure 5A:
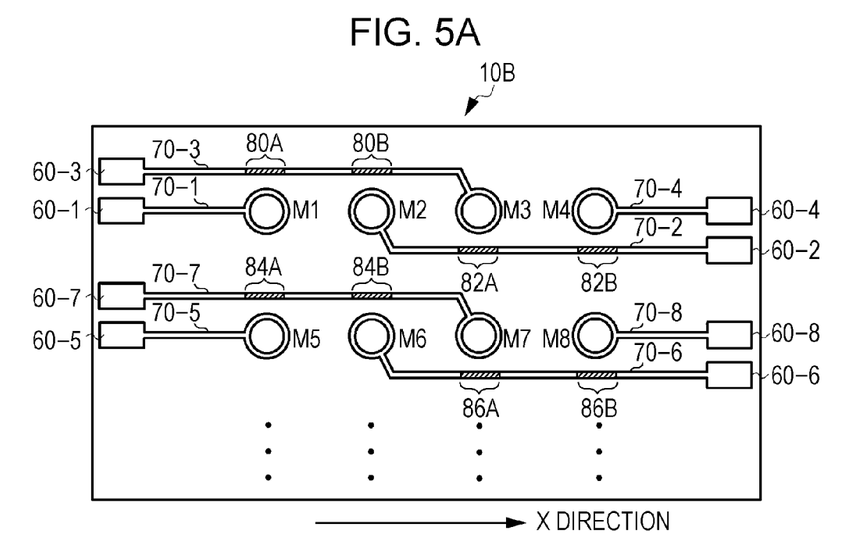
FIGS. 5A and 5B are schematic plan views of a vertical-cavity surface-emitting laser array according to a second exemplary embodiment of the present invention.

FIG. 5A is a plan view of a VCSEL array 10B according to the second exemplary embodiment. The element forming area 20 has eight mesas M1 to M8 in a 2-row-by-4-column arrangement. The mesas M1 to M4 and the mesas M5 to M8 are arranged linearly in an X direction on a surface parallel to the principal surface of the substrate 100. Electrode pads 60-1, 60-3, 60-5, and 60-7 for driving the mesas M1, M3, M5, and M7 are disposed at a first end of the array or the chip, and electrode pads 60-2, 60-4, 60-6, and 60-8 for driving the mesas M2, M4, M6, and M8 are disposed at a second end opposite to the first end. The electrode pads 60-1 to 60-8 may be formed in a wiring forming area as in the first exemplary embodiment, or may be formed on the base surface of the element forming area 20.

The mesa M1 is connected to the electrode pad 60-1 via a metal wire 70-1, and the mesa M2 is connected to the electrode pad 60-2 via a metal wire 70-2. Likewise, the mesas M3 to M8 are connected to the electrode pads 60-3 to 60-8 via metal wires 70-3 to 70-8, respectively. In the second exemplary embodiment, the metal wires 70-1 to 70-8 also function as annular electrodes of the mesas M1 to M8. Therefore, the metal wires 70-1 to 70-8 are electrically connected to the contact layers of the upper DBRs 106 in the mesas M1 to M8.

Referring to the mesa M1, the metal wire 70-3 includes a distortion applying segment 80A that extends in a fixed direction relative to the mesa M1. Specifically, when viewed from the optical axis of the mesa M1, the distortion applying segment 80A extends in the X direction, is located at the fixed distance D from the optical axis of the mesa M1, and applies anisotropic distortion in the X direction to the active region of the mesa M1. Referring to the mesa M2, the metal wire 70-3 includes a distortion applying segment 80B extending in the X direction and located at the fixed distance D from the optical axis of the mesa M2. The distortion applying segment 80B applies anisotropic distortion in the X direction to the active region of the mesa M2. Referring to the mesa M3, the metal wire 70-2 includes a distortion applying segment 82A extending in the X direction relative to the mesa M3 and located at the fixed distance D therefrom. The distortion applying segment 82A applies anisotropic distortion in the X direction to the active region of the mesa M3. Referring to the mesa M4, the metal wire 70-2 includes a distortion applying segment 82B extending in the X direction relative to the mesa M4 and located at the fixed distance D therefrom. The distortion applying segment 82B applies anisotropic distortion in the X direction to the active region of the mesa M4. Referring to the mesas M5 to M8, the metal wire 70-7 similarly includes distortion applying segments 84A and 84B that apply anisotropic distortion in the X direction to the mesas M5 and M6, and the metal wire 70-6 similarly includes distortion applying segments 86A and 86B that apply anisotropic distortion in the X direction to the mesas M7 and M8.

Accordingly, the metal wires 70-1 to 70-8 also function as the annular electrodes of the mesas M1 to M8, and the selected metal wires 70-2, 70-3, 70-6, and 70-7 include the distortion applying segments 80A, 80B, 82A, 82B, 84A, 84B, 86A, and 86B for applying anisotropic distortion in the X direction to the mesas M1 to M8, thereby allowing for efficient utilization of the wires and achieving a space-saving array configuration. Moreover, the polarization of fundamental-transverse-mode light output from the mesas M1 to M8 may be stabilized in a certain direction.

Figure 5B:
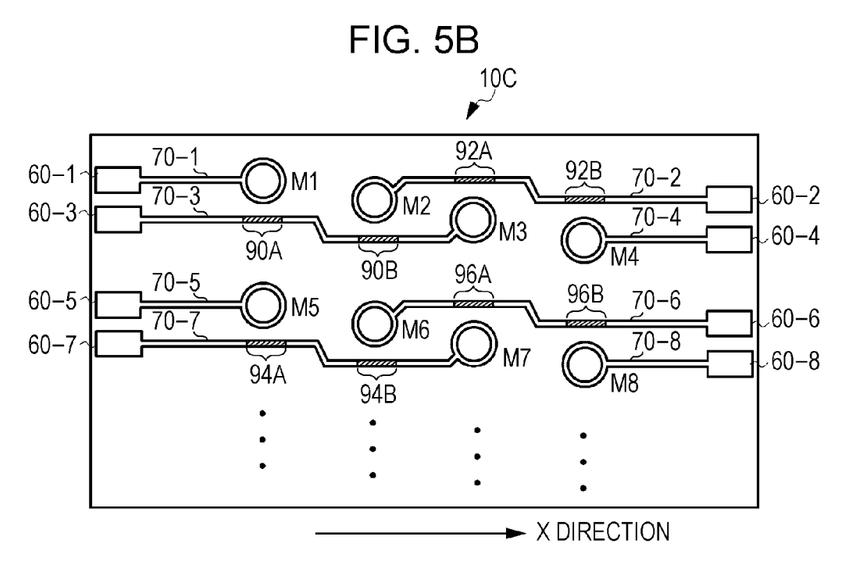

FIG. 5B illustrates a VCSEL array 10C in which the mesas M1 to M4 and the mesas M5 to M8 are linearly arranged in an inclined fashion at a certain angle relative to the X direction. Similar to the example shown in FIG. 5A, the metal wires 70-2, 70-3, 70-6, and 70-7 that are selected from among the metal wires 70-1 to 70-8 include distortion applying segments 90A, 90B, 92A, 92B, 94A, 94B, 96A, and 96B for applying anisotropic distortion in the X direction to the mesas M1 to M8. Accordingly, a space-saving array configuration may be achieved, and the polarization of fundamental-transverse-mode light output from the mesas M1 to M8 may be stabilized in a certain direction.

In the above examples, the VCSEL arrays 10B and 10C have a 2-row-by-4-column arrangement. Alternatively, with the metal wires 70-1 to 70-4 for the mesas M1 to M4 constituting one row being defined as a base pattern, a VCSEL array having an n-row-by-4-column arrangement may be obtained by repeating the base pattern over multiple rows. With reference to the two intermediate mesas M2 and M3 in the base pattern of the mesas M1 to M4, the metal wire 70-2 for the mesa M2 that is closer to the left end of the array extends toward the right end of the array, and the metal wire 70-3 for the mesa M3 that is closer to the right end of the array extends toward the left end of the array. Moreover, the metal wire 70-2 has distortion applying segments for the mesas located at the right side of the array, and the metal wire 70-3 has distortion applying segments for the mesas located at the left side of the array.

Figure 6:
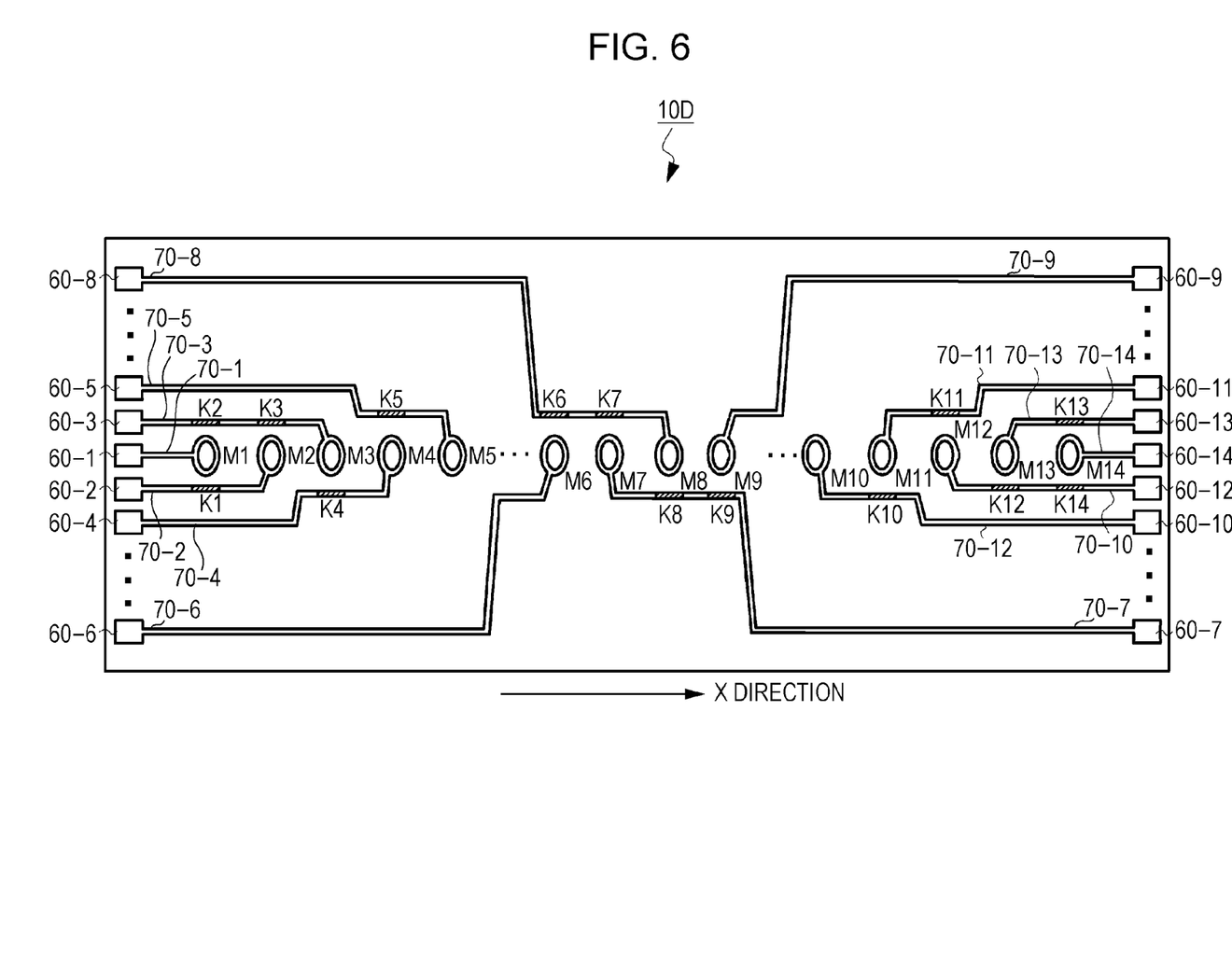
FIG. 6 is a schematic plan view of a vertical-cavity surface-emitting laser array according to a third exemplary embodiment of the present invention.

Next, a third exemplary embodiment of the present invention will be described. The third exemplary embodiment relates to a metal-wire pattern of a VCSEL array having M mesas (M being five or more) in a single row. FIG. 6 is a schematic plan view of a VCSEL array 10D having at least 14 mesas M1 to M14.

The VCSEL array 10D includes at least 14 mesas M1 to M14, electrode pads 60-1 to 60-14, and metal wires 70-1 to 70-14. Similar to the second exemplary embodiment, the metal wires 70-1 to 70-14 also function as annular electrodes of the mesas. Metal wires selected from among the metal wires 70-1 to 70-14 include distortion applying segments K1 to K14 (represented by black shaded areas in FIG. 6) for applying anisotropic distortion to the mesas M1 to M14. The electrode pads 60-1 to 60-6 for the mesas M1 to M6 are disposed at the left end of the array, and the electrode pads 60-9 to 60-14 for the mesas M9 to M14 are disposed at the right end of the array. The electrode pads 60-7 and 60-8 for the two mesas M7 and M8 in the middle are respectively disposed at the opposite ends of the array. In the example shown in FIG. 6, the mesa M1 receives distortion from the distortion applying segments K1 and K2 of the two metal wires 70-2 and 70-3. Because the two distortion applying segments K1 and K2 extend parallel to each other with the mesa M1 interposed therebetween, that is, the two distortion applying segments K1 and K2 are disposed at symmetric positions with respect to the mesa M1, the mesa M1 receives distortion in the X direction.

With reference to the metal wire 70-1 of the mesa M1, the metal wires 70-3 and 70-5 for the odd-numbered mesas M3 and M5 are disposed above the metal wire 70-1, whereas the metal wires 70-2, 70-4, and 70-6 for the even-numbered mesas M2, M4, and M6 are disposed below the metal wire 70-1. The mesa M2 receives distortion in the X direction from the distortion applying segment K3 of the metal wire 70-3 for the neighboring mesa M3. The mesa M3 receives distortion in the X direction from the distortion applying segment K4 of the metal wire 70-4 for the neighboring mesa M4. The mesa M5 receives distortion in the X direction from a distortion applying segment of a metal wire for a neighboring even-numbered mesa (not shown).

With regard to the two mesas M7 and M8 disposed in the middle, the metal wire 70-7 for the mesa M7 is connected to the electrode pad 60-7, and the metal wire 70-8 for the mesa M8 is connected to the electrode pad 60-8. The metal wires 70-7 and 70-8 extend in opposite directions from each other toward the corresponding electrode pads 60-7 and 60-8. The mesa M7 receives distortion from the distortion applying segment K7 of the metal wire 70-8, and the mesa M8 receives distortion from the distortion applying segment K8 of the metal wire 70-7. Similar to the mesas M1 to M6, the mesas M9 to M14 receive distortion from the distortion applying segments K9 to K14 of the corresponding metal wires for the neighboring mesas. By alternately providing the distortion applying segments in the metal wires for the neighboring mesas in this manner, the metal wires have a substantially symmetric pattern, thereby allowing for efficient utilization of the wires and achieving a space-saving array configuration.

Figure 7:
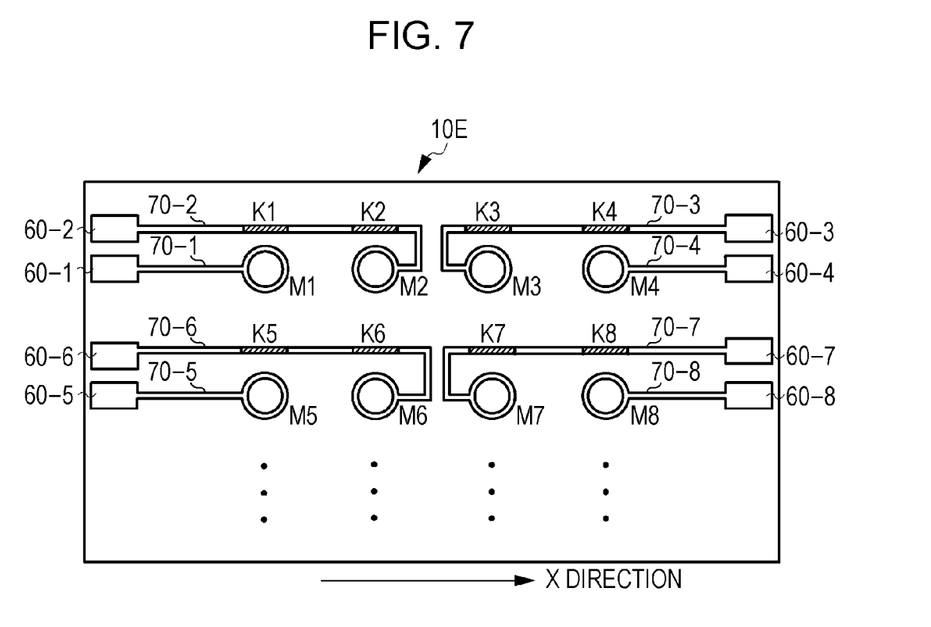
FIG. 7 is a schematic plan view of a vertical-cavity surface-emitting laser array according to a fourth exemplary embodiment of the present invention.

Next, a fourth exemplary embodiment of the present invention will be described with reference to FIG. 7. In a VCSEL array 10E according to the fourth exemplary embodiment, the metal wires apply distortion to their own mesas. The VCSEL array 10E has eight mesas M1 to M8 in a 2-row-by-4-column arrangement. The mesas M1 to M8 are connected to electrode pads 60-1 to 60-8 via metal wires 70-1 to 70-8, respectively. The mesa M1 receives distortion in the X direction from a distortion applying segment K1 included in the metal wire 70-2 for the neighboring mesa M2. The mesa M2 receives distortion in the X direction from a distortion applying segment K2 included in its own metal wire 70-2 (i.e., for the mesa M2). This relationship is the same for the remaining mesas M3 to M8. According to the fourth exemplary embodiment, since the metal wires have distortion applying segments for their own mesas, the wiring space may be efficiently utilized.

Figure 8A:
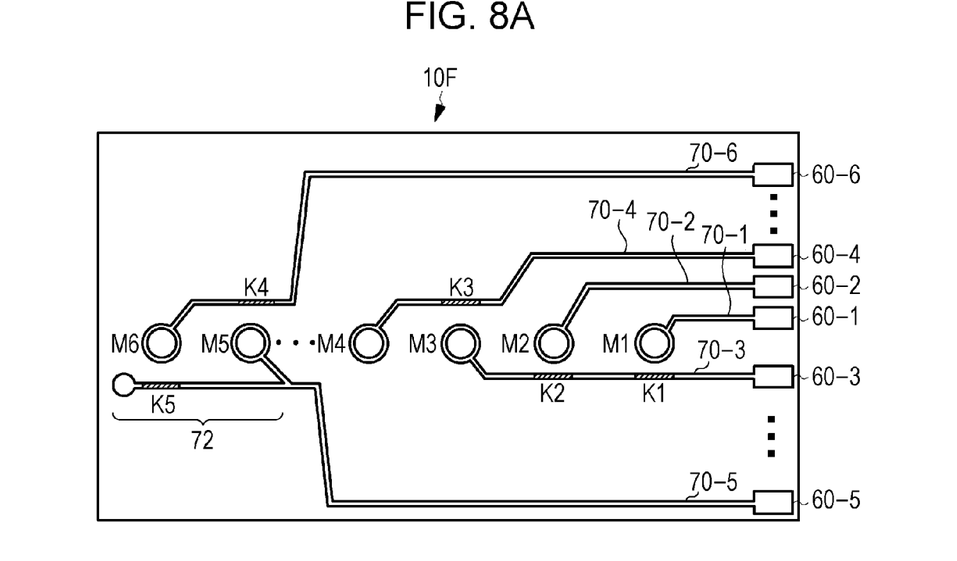
FIGS. 8A and 8B are schematic plan views of a vertical-cavity surface-emitting laser array according to a fifth exemplary embodiment of the present invention.

Next, a fifth exemplary embodiment of the present invention will be described with reference to FIGS. 8A and 8B. The fifth exemplary embodiment relates to a VCSEL array 10F in which electrode pads (power supplying sections) are disposed only at one side of the array. The VCSEL array 10F shown in FIG. 8A includes mesas M1 to M6 that are linearly arranged and electrode pads 60-1 to 60-6 that are disposed at one side of the array. Similar to the third exemplary embodiment (see FIG. 6), the mesas M1 to M4 receive distortion from distortion applying segments K1 to K3 included in metal wires for the neighboring mesas. With regard to the mesas M5 and M6, since there are no mesas opposite to the mesas M1 to M4, a metal wire 70-5 for the mesa M5 is provided with a dummy section 72 that extends in the X direction. The dummy section 72 includes a distortion applying segment K5 that applies anisotropic distortion in the X direction to the active region of the mesa M6.

Figure 8B:
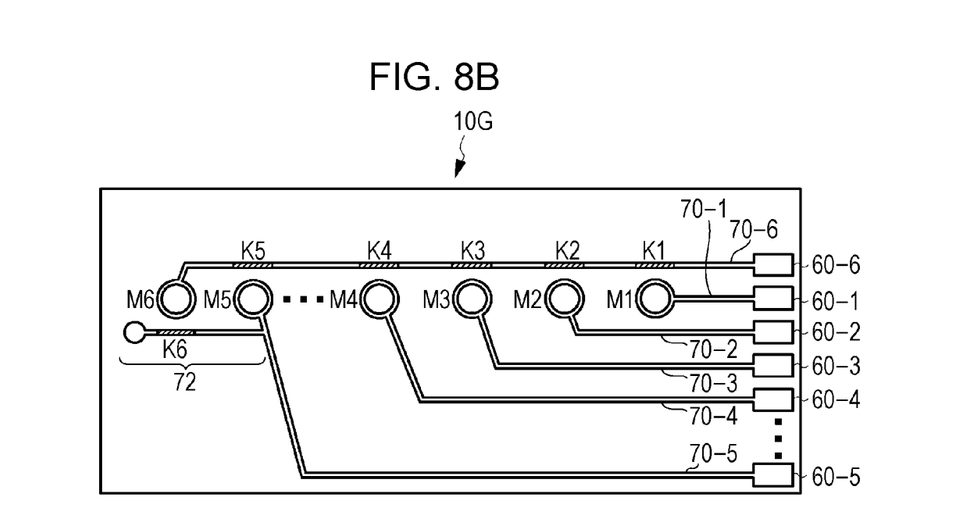

A VCSEL array 10G illustrated in FIG. 8B shows another wiring example of the metal wires. In this example, a metal wire 70-6 includes distortion applying segments K1 to K5 that apply distortion in the X direction to the mesas M1 to M5, respectively. Furthermore, the metal wire 70-5 for the mesa M5 is provided with a dummy section 72 disposed adjacent to the mesa M6 and extending in the X direction. The dummy section 72 is provided with a distortion applying segment K6 that applies anisotropic distortion in the X direction to the active region of the mesa M6. Because the number of metal wires provided with distortion applying segments is limited in the fifth exemplary embodiment, the size of the array in a Y direction may be reduced.

Figure 9:
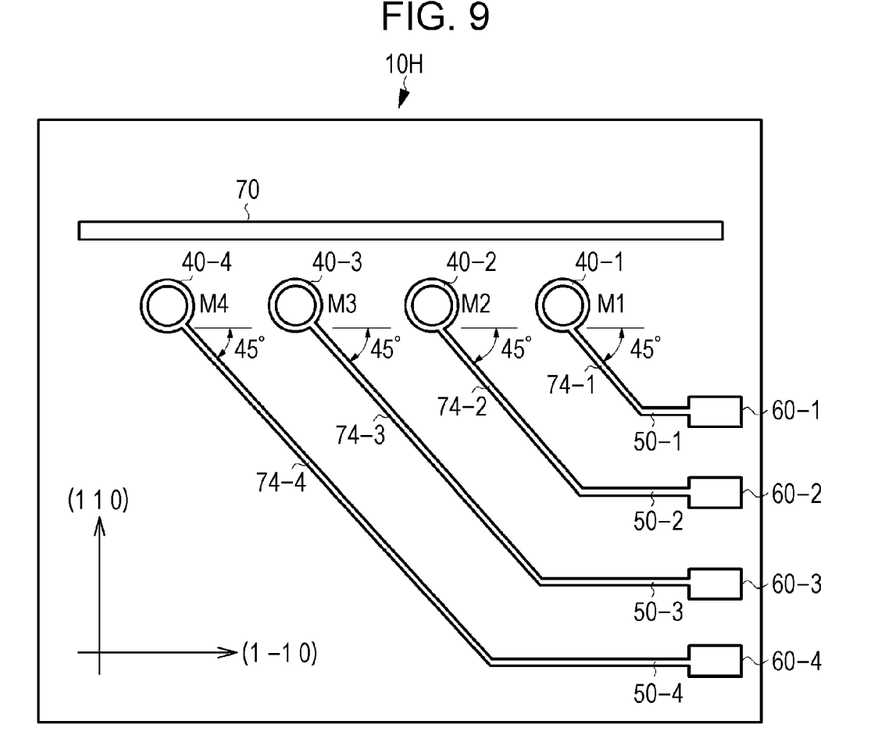
FIG. 9 is a schematic plan view of a vertical-cavity surface-emitting laser array according to a sixth exemplary embodiment of the present invention.

Next, a sixth exemplary embodiment of the present invention will be described. In a VCSEL of a group III-V compound semiconductor type, polarization tends to occur in a plane direction (110) or (1-10). Therefore, by aligning the extending direction of the metal wires near the mesas with the aforementioned plane direction (110) or (1-10), more effective polarization control may be achieved. FIG. 9 is a schematic plan view of a VCSEL array 10H according to the sixth exemplary embodiment. Mesas M1 to M4 are arranged in the plane direction (1-10), and a metal wire 70 also extends in the plane direction (1-10).

In the example shown in FIG. 9, annular electrodes 40-1 to 40-4 of the mesas M1 to M4 are connected to electrode pads 60-1 to 60-4 via electrode wires 50-1 to 50-4. In this case, the electrode wires 50-1 to 50-4 may have extension segments 74-1 to 74-4 that extend obliquely from the annular electrodes 40-1 to 40-4, respectively. The direction in which the extension segments 74-1 to 74-4 extend is inclined at about 45° relative to the plane direction (110) or (1-10). The wires of the extension segments 74-1 to 74-4 extending from the mesas apply stress to the active regions. Thus, inclining the extension segments 74-1 to 74-4 at about 45° relative to the plane direction (110) or (1-10) may at least prevent a state where the polarization is intensified or weakened only in one of the plane directions (110) and (1-10). Therefore, the stress applied by the distortion applying segment of the metal wire 70 extending near the mesas may purely affect the polarization. Although the metal wire 70 and the electrode wires 50 are provided independent of each other in the example shown in FIG. 9, if the metal wire is made to also function as electrode wires, as in the second to fourth exemplary embodiments, the metal wire may be provided with extension segments.

Although the current confinement layer 108 is composed of AlAs as an example in the above exemplary embodiments, the current confinement layer 108 may alternatively be composed of AlGaAS whose Al composition is higher than that of the other DBRs. Furthermore, the VCSEL is not limited to a GaAs-based type, and may use other kinds of group III-V compound semiconductors.

Figure 10:
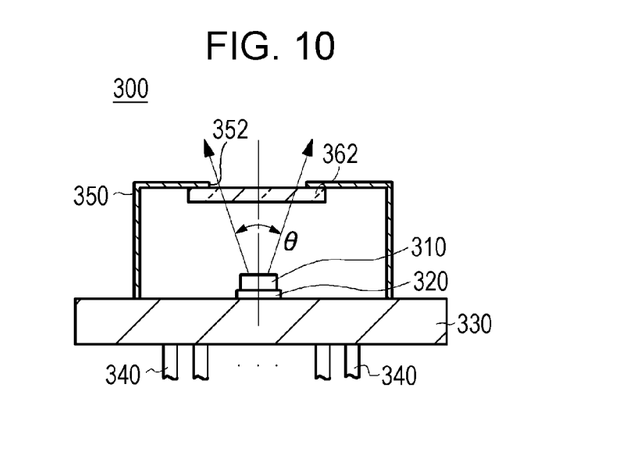
FIG. 10 is a schematic cross-sectional view showing the configuration of a vertical-cavity surface-emitting laser device in which an optical component is mounted to the vertical-cavity surface-emitting laser array according to one of the above exemplary embodiments.

Next, a vertical-cavity surface-emitting laser device, and an optical information processing apparatus, and an optical transmission apparatus that use the VCSEL array according to one of the above exemplary embodiments will be described with reference to the drawings. FIG. 10 is a cross-sectional view showing the configuration of a vertical-cavity surface-emitting laser device having the VCSEL array and an optical component mounted (packaged) therein. A vertical-cavity surface-emitting laser device 300 is formed by fixing a chip 310 having the VCSEL array to a disk-shaped metallic stem 330 by using an electrically conductive adhesive 320. Multiple electrically conductive lead wires 340 are inserted into through-holes (not shown) formed in the stem 330 so that the lead wires 340 are electrically connected to the corresponding electrode pads 60 and the n-side electrode 120 of the VCSEL array. A rectangular hollow cap 350 is secured above the stem 330 including the chip 310, and a flat glass plate 362 is secured to an opening 352 located in the middle of the cap 350. When a forward driving current is applied between selected lead wires 340, laser light is emitted perpendicularly from the chip 310. The distance between the chip 310 and the flat glass plate 362 is adjusted such that the flat glass plate 362 is included within an angle θ of divergence of the laser light from the chip 310. Furthermore, the cap 350 may contain a temperature sensor or a light receiving element used for monitoring the light emission state of the VCSEL array.

Figure 11:
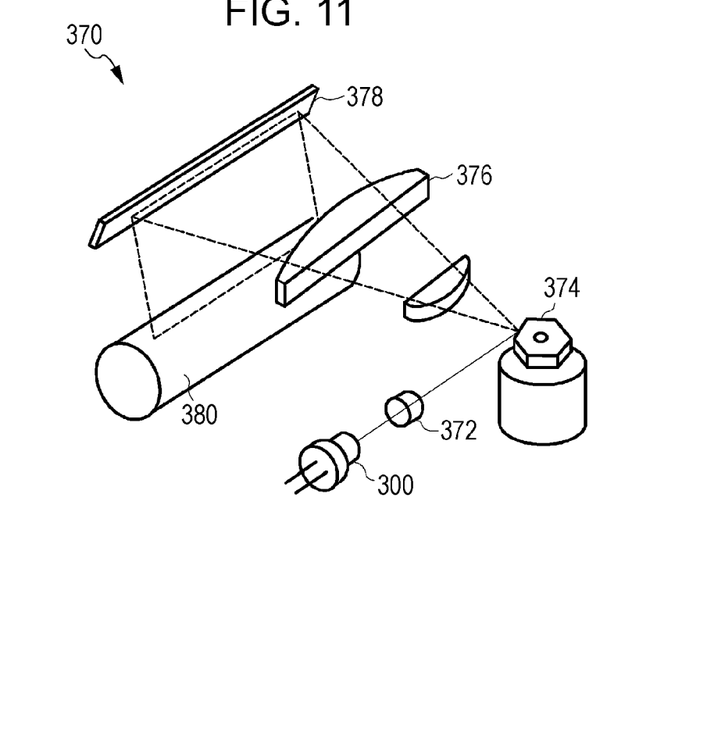
FIG. 11 illustrates a configuration example of a light source apparatus equipped with the vertical-cavity surface-emitting laser device according to the above exemplary embodiment.

FIG. 11 illustrates an example in which the VCSEL is applied to a light source of an optical information processing apparatus. An optical information processing apparatus 370 includes a collimator lens 372 that receives laser light from the vertical-cavity surface-emitting laser device 300 equipped with the VCSEL array as shown in FIG. 10, a polygonal mirror 374 that rotates at a certain speed and reflects the light beam from the collimator lens 372 with a certain angle of divergence, an fθ lens 376 that receives the laser light from the polygonal mirror 374 and radiates the laser light toward a reflecting mirror 378, the reflecting mirror 378, which is linear, and a photoconductor drum (recording medium) 380 that forms a latent image based on reflected light from the reflecting mirror 378. Accordingly, the VCSEL may be used as a light source of an optical information processing apparatus, such as a copier or printer, that includes an optical system that focuses the laser light from the VCSEL onto a photoconductor drum and a mechanism that scans the focused laser light over the photoconductor drum.

Figure 12:
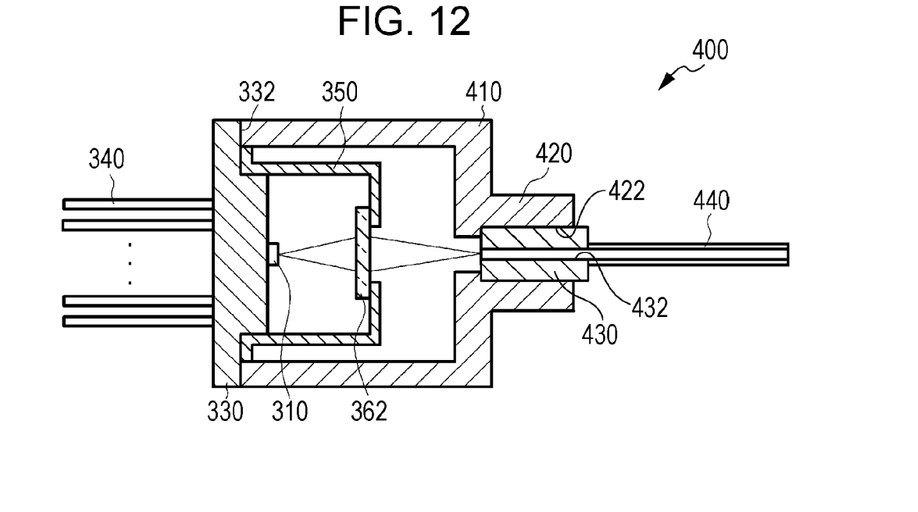
FIG. 12 is a schematic cross-sectional view showing the configuration of an optical transmission apparatus equipped with the vertical-cavity surface-emitting laser device shown in FIG. 10.

FIG. 12 is a cross-sectional view showing a configuration in which the vertical-cavity surface-emitting laser device 300 shown in FIG. 10 is applied to an optical transmission apparatus. An optical transmission apparatus 400 includes a cylindrical housing 410 secured to the stem 330, a sleeve 420 integrally formed on an end surface of the housing 410, a ferrule 430 supported within an opening 422 of the sleeve 420, and an optical fiber 440 supported by the ferrule 430. An end of the housing 410 is secured to a flange 332 formed around the stem 330 in the circumferential direction thereof. The ferrule 430 is accurately positioned within the opening 422 of the sleeve 420 so that the optical axis of the optical fiber 440 is substantially aligned with the center of the flat glass plate 362. A core wire of the optical fiber 440 is supported within a through-hole 432 of the ferrule 430. Laser light emitted from the surface of the chip 310 is input to the core wire of the optical fiber 440 via the flat glass plate 362 so as to be transmitted. Furthermore, the optical transmission apparatus 400 may include a drive circuit for applying an electric signal to the lead wires 340. Moreover, the optical transmission apparatus 400 may have a receiving function for receiving an optical signal via the optical fiber 440.

Although the exemplary embodiments of the present invention have been described in detail, the present invention is not to be limited to specific exemplary embodiments and permits various modifications and alterations within the scope of the invention defined by the claims.

What is claimed is:

1. A vertical-cavity surface-emitting laser array comprising:
    a substrate having an element forming area;
    a plurality of columnar structures formed in the element forming area on the substrate; and
    at least one metal wire formed adjacent to the plurality of columnar structures,
    wherein the at least one metal wire is provided separately from electrode wires of the plurality of columnar structures,
    wherein each columnar structure includes a lower semiconductor reflector of a first conductivity type, an upper semiconductor reflector of a second conductivity type, and an active region formed between the lower semiconductor reflector and the upper semiconductor reflector,
    wherein the columnar structure emits light in a direction perpendicular to the substrate, and
    wherein the at least one metal wire has a distortion applying segment that extends in the same direction relative to the plurality of columnar structures so as to apply distortion to the active region of each columnar structure such that lights emitted from all of the plurality of columnar structures are polarized in a same direction.

2. The vertical-cavity surface-emitting laser array according to claim 1, wherein the columnar structures are linearly arranged, and the distortion applying segment extends parallel to a direction in which the columnar structures are arranged.

3. The vertical-cavity surface-emitting laser array according to claim 1, wherein the at least one metal wire is composed of a material that is the same as a material used for forming electrode wires electrically connected to the upper semiconductor reflectors of the columnar structures, and
    wherein the at least one metal wire and the electrode wires are formed in the same process.

4. The vertical-cavity surface-emitting laser array according to claim 1, wherein the distortion applying segment extends in a plane direction (110) or (1-10) of the substrate.

5. The vertical-cavity surface-emitting laser array according to claim 4, wherein the distortion applying segment of the at least one metal wire extends in the plane direction (110) or (1-10) of the substrate, and
    wherein the at least one metal wire includes an extension segment that extends at an angle of about 45° relative to the plane direction of the substrate from electrodes of the columnar structures.

6. The vertical-cavity surface-emitting laser array according to claim 1, wherein each columnar structure has a base, a side, and a top,
    wherein the base, the side, and the top are covered with an insulating film, and wherein the distortion applying segment is formed at the base of the columnar structure via the insulating film.

7. The vertical-cavity surface-emitting laser array according to claim 1, wherein each columnar structure has a current confinement layer that includes an oxidized region formed by selectively oxidizing a side surface of the columnar structure and an electrically conductive region surrounded by the oxidized region.

8. The vertical-cavity surface-emitting laser array according to claim 1, wherein the at least one metal wire is composed of gold or a material including gold and applies tensile stress to the active regions of the plurality of columnar structures.

9. A vertical-cavity surface-emitting laser device comprising:
the vertical-cavity surface-emitting laser array according to claim 1; and
an optical component that receives light from the vertical-cavity surface-emitting laser array.

10. An optical transmission apparatus comprising:
the vertical-cavity surface-emitting laser array device according to claim 9; and
a transmitting unit that transmits laser light emitted from the vertical-cavity surface-emitting laser array device via an optical medium.

11. An information processing apparatus comprising:
the vertical-cavity surface-emitting laser array according to claim 1;
a focusing unit that focuses laser light emitted from the vertical-cavity surface-emitting laser array onto a recording medium; and
a mechanism that scans the laser light focused by the focusing unit over the recording medium.

12. The vertical-cavity surface-emitting laser array according to claim 1, wherein the at least one metal wire is electrically disconnected from the plurality of columnar structures.

* * * * *